(12) United States Patent
Yang et al.

(10) Patent No.: US 9,803,842 B2
(45) Date of Patent: Oct. 31, 2017

(54) LED DRIVING STRUCTURE

(71) Applicant: Shenzhen Longood Intelligent Electric Co., Ltd., Shenzhen (CN)

(72) Inventors: Xiong Yang, Shenzhen (CN); Qingsong Chu, Shenzhen (CN); Yu Luo, Shenzhen (CN); Jun Ding, Shenzhen (CN)

(73) Assignee: SHENZHEN LONGOOD INTELLIGENT ELECTRIC CO., LTD., Shenzhen (CN)

( * ) Notice: Subject to any disclaimer, the term of this patent is extended or adjusted under 35 U.S.C. 154(b) by 0 days.

(21) Appl. No.: 14/953,372

(22) Filed: Nov. 29, 2015

(65) Prior Publication Data

US 2017/0114991 A1    Apr. 27, 2017

(30) Foreign Application Priority Data

Oct. 26, 2015 (CN) .................... 2015 2 0835098 U

(51) Int. Cl.

| *F21V 21/00* | (2006.01) |
| *F21V 23/00* | (2015.01) |
| *F21V 23/02* | (2006.01) |
| *F21V 29/508* | (2015.01) |
| *F21V 29/89* | (2015.01) |

(52) U.S. Cl.
CPC .......... *F21V 23/007* (2013.01); *F21V 23/001* (2013.01); *F21V 23/023* (2013.01); *F21V 29/508* (2015.01); *F21V 29/89* (2015.01)

(58) Field of Classification Search
CPC .... F21V 23/007; F21V 23/023; F21V 17/104; F21V 17/18; F21V 17/005; F21V 19/0045; F21V 15/01
USPC ............................................ 362/217.13, 374
See application file for complete search history.

(56) References Cited

U.S. PATENT DOCUMENTS

| 6,382,803 | B1 * | 5/2002 | Arumugasaamy ........ F21V 7/09 359/850 |
| 8,687,357 | B2 * | 4/2014 | Nagano .............. H05K 7/20918 165/104.33 |
| 9,671,091 | B2 * | 6/2017 | Jones ........................ F21V 7/00 |
| 2015/0216065 | A1 * | 7/2015 | Chai ........................ B23P 19/04 361/679.01 |
| 2016/0230964 | A1 * | 8/2016 | Boxler ................... F21V 17/005 |
| 2016/0327257 | A1 * | 11/2016 | Li ........................ F21V 23/023 |

* cited by examiner

*Primary Examiner* — Peggy Neils
*Assistant Examiner* — William N Harris
(74) *Attorney, Agent, or Firm* — Franklin & Associates International Inc.; Matthew F. Lambrinos

(57) ABSTRACT

A LED driving structure, includes: a lower housing, being a box structure and having an opening end; a upper housing positioned on the opening end of the lower housing, and covering a part of the opening end; a separating board positioned an end of the upper housing and being perpendicular to the upper housing, the upper housing, the separating board and a part of the lower housing cooperative forming an electrical chamber; and an upper cover positioned on the opening end of the lower housing, wherein the upper cover and the upper housing cooperatively cover the opening end, the upper cover, the separating board and the rest part of the lower housing cooperatively form a wiring chamber.

11 Claims, 5 Drawing Sheets

LED DRIVING STRUCTURE

CROSS-REFERENCE TO RELATED APPLICATIONS

This application claims priority under 35 U.S.C. §119 to Chinese Patent Application Serial Number CN 201520835098.2, filed on Oct. 26, 2015, the disclosure of which is incorporated herein by reference in its entirety.

FIELD OF THE INVENTION

The present disclosure relates to LED (light emitting diode) photoelectric technologies, and more particularly, relates to a LED driving structure.

BACKGROUND OF THE INVENTION

A LED driving structure is generally packaged by a metallic housing, when assembly, in order to meet a requirement of the United States UL safety certification. A metal housing junction box is further provided at an external of the power module to protect a power input/output connection. Thus, much of cost is increased in practical use, and a design difficulty is increased.

In order to solve the problem of high cost, the conventional LED driving structure adopts a big metal box to seal the power module and the output/input cable therein. However, the temperature of the operational environment of the power module is increased; the operational condition of the power module is harsh, thereby reducing a service life of the LED driving structure.

SUMMARY OF THE INVENTION

Therefore, it is necessary to provide a LED driving structure having a better working environment for the power supply.

A LED driving structure includes: a lower housing, being a box structure and having an opening end; a upper housing positioned on the opening end of the lower housing, and covering a part of the opening end; a separating board positioned on an end of the upper housing and being perpendicular to the upper housing, the upper housing, the separating board, and a part of the lower housing cooperatively form an electrical chamber; and an upper cover positioned on the opening end of the lower housing, wherein the upper cover and the upper housing cooperatively cover the opening end, and the upper cover, the separating board, and the remaining part of the lower housing cooperatively form a wiring chamber.

In above LED driving structure, the lower housing, the upper housing, the separating board, and the upper cover and other components cooperatively form the independent electrical chamber and the independent wiring chamber, to separate the electrical module such as the power source module from input/output wiring wires, thereby ensuring the power source module to be able of working in an independent environment, reducing a temperature of the working environment, improving the working environment, extending a service life of the power source module, and meeting a requirement of the United States UL safety certification

BRIEF DESCRIPTION OF THE DRAWINGS

These and other features of the present invention will become readily apparent upon further review of the following specification and drawings. In the drawings, like reference numerals designate corresponding parts throughout the views. Moreover, components in the drawings are not necessarily drawn to scale, the emphasis instead being placed upon clearly illustrating the principles of the present disclosure.

DETAILED DESCRIPTION OF THE EMBODIMENTS

Figure 1:
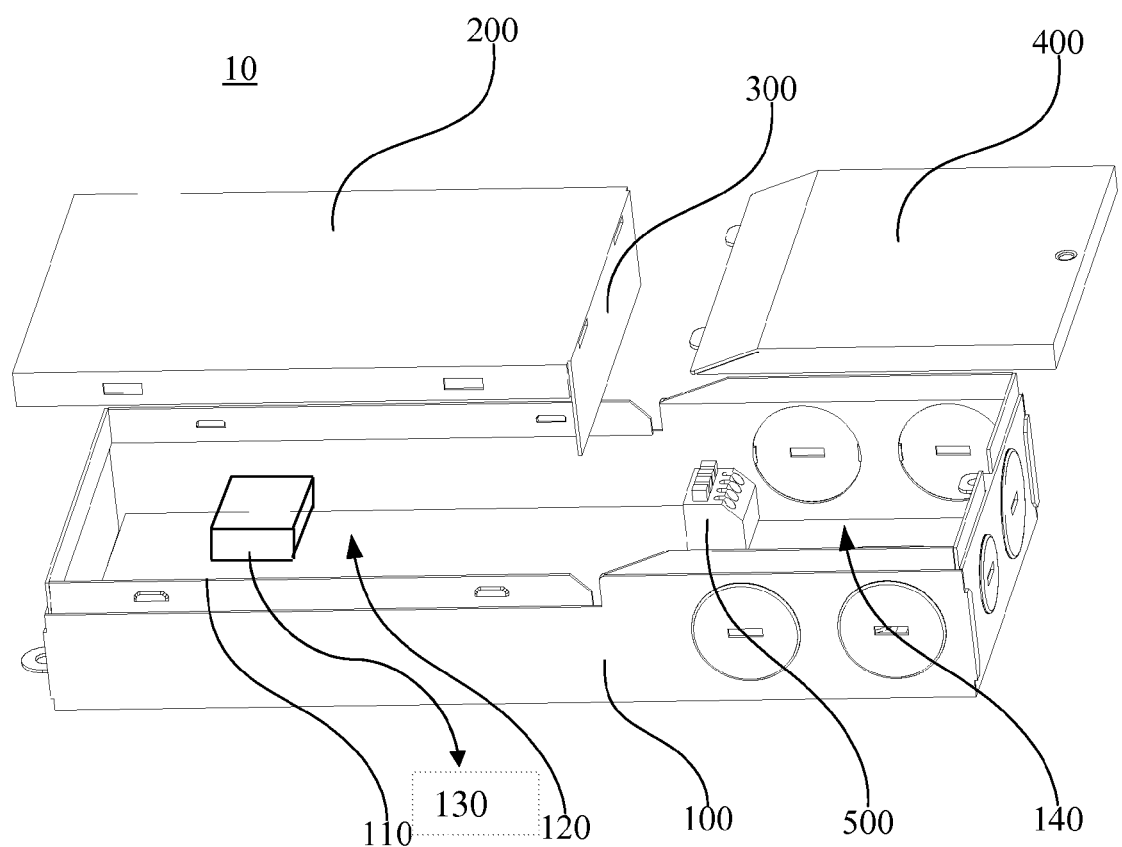
FIG. 1 is an exploded view of a LED driving structure according to an embodiment of the invention.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
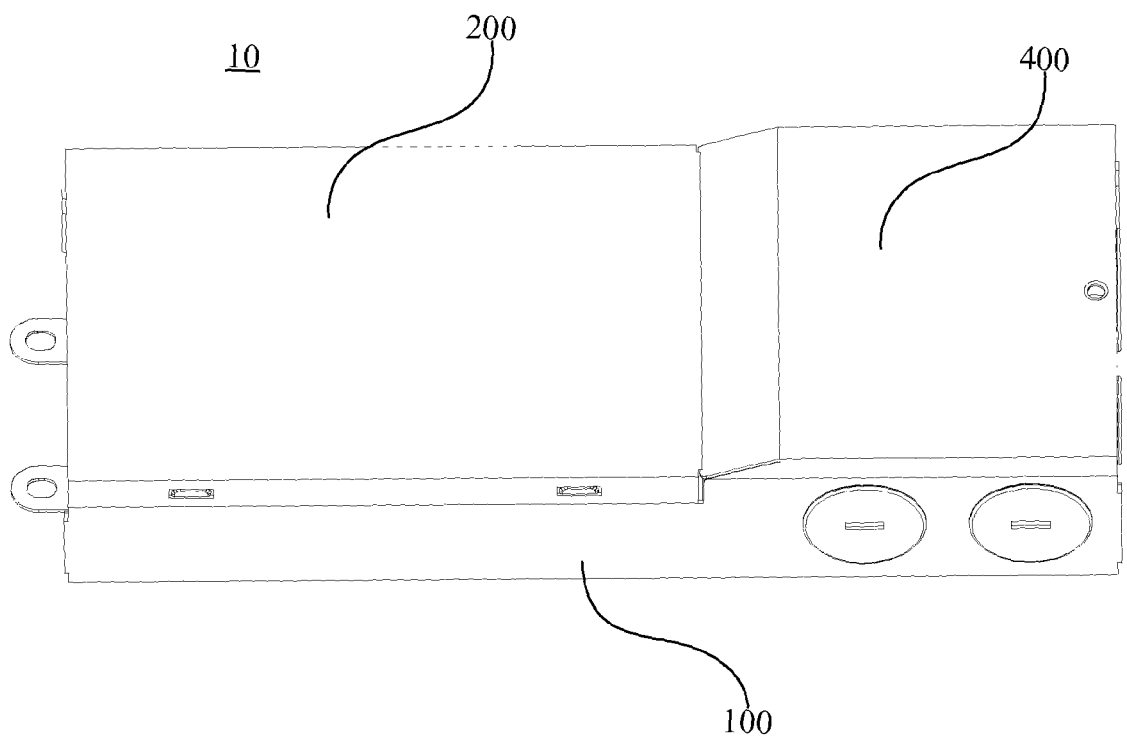
FIG. 2 is a perspective assembled view of the LED driving structure of FIG. 1.

Referring to FIGS. 1 and 2, an LED driving structure 10 according to an embodiment is configured to be electrically connected to an LED light source to drive the LED light source. The LED driving structure 10 includes a lower housing 100, an upper housing 200, a separating board 300, and an upper cover 400.

Figure 3:
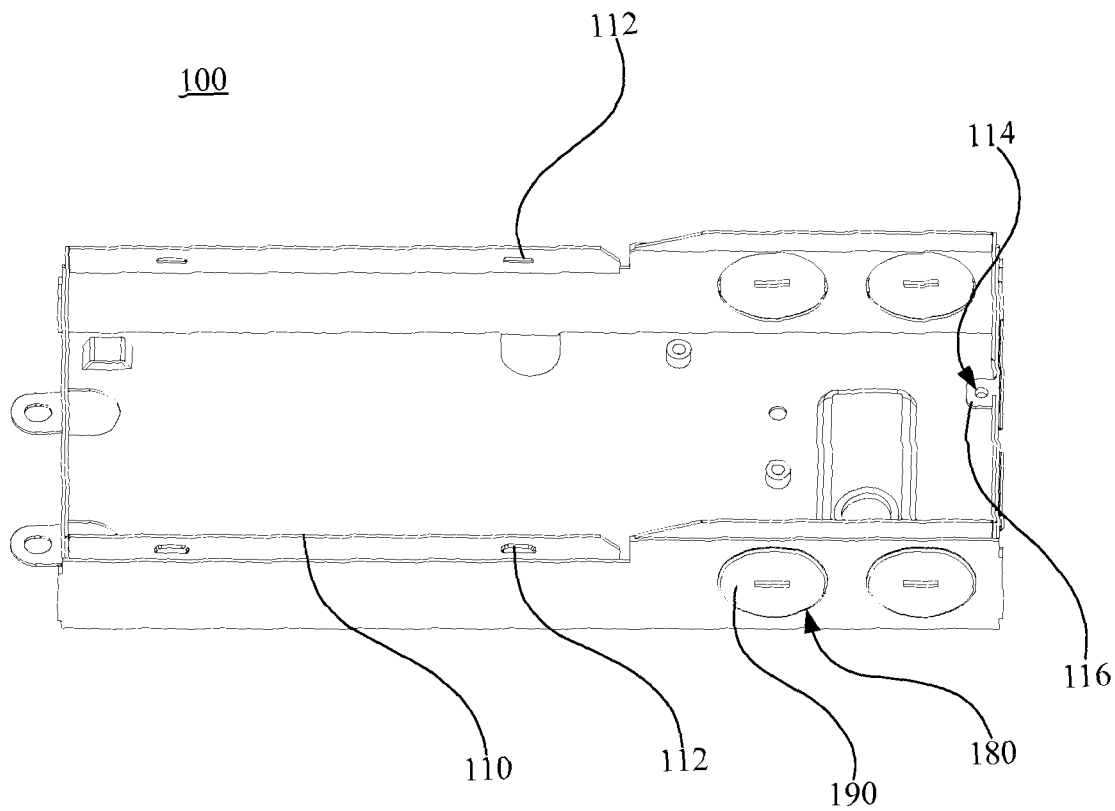
FIG. 3 is a perspective view of a lower housing of the LED driving structure of FIG. 1.

Referring also to FIG. 3, the lower housing 100 has a hollow box structure, and includes an opening end 110. The lower housing 100 is generally made of metallic material, thus it is rigid feature and has a certain heat dissipation capacity.

Figure 4:
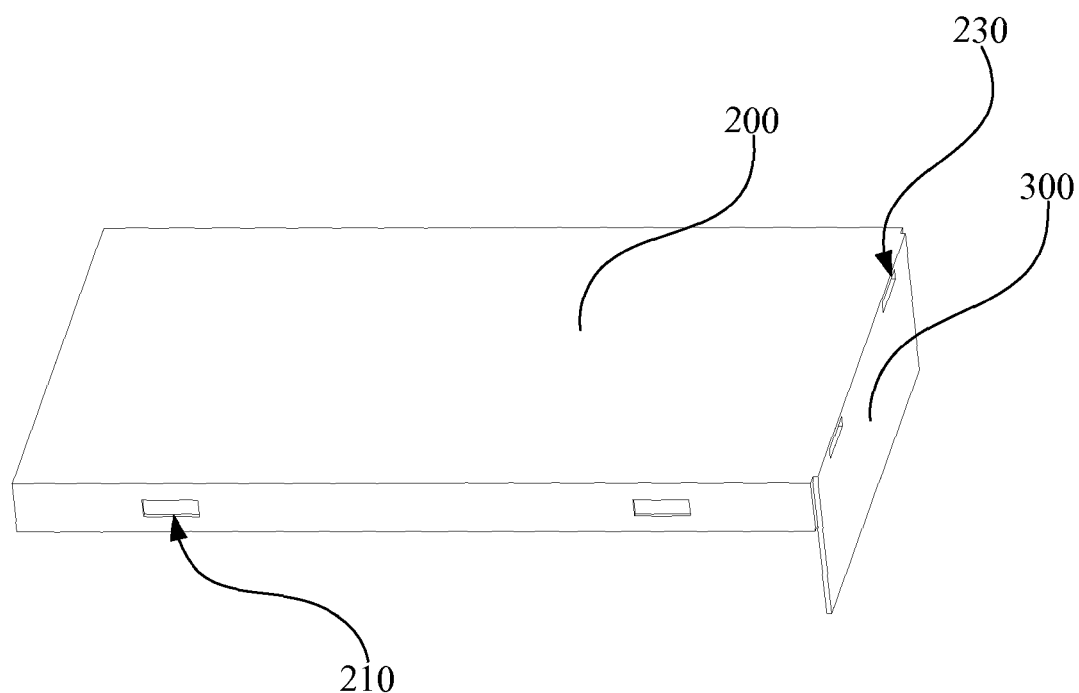
FIG. 4 is a perspective view of an upper housing and a separating board of the LED driving structure of FIG. 1.

Referring also to FIG. 4, the upper housing 200 is positioned on the opening end 110 of the lower housing 100, and covers a part of the opening end 110. The separating board 300 is arranged on an end of the upper housing 200 and perpendicular to the upper housing 200. The upper housing 200, the separating board 300 and a part of the lower housing 100 cooperatively form an electrical chamber 120. The LED driving structure 10 can further include a power source module 130 received in the electrical chamber 120.

In the illustrated embodiment, the power source module 130 can specifically be a circuit board connected to electronic components. The upper housing 200 and the separating board 300 can both be made of metallic material. The separating board 300 and the upper housing 200 are integrally formed. The lower housing 100 is further provided with a plurality of electric wire terminals (not shown) at a bottom for connecting with a plurality of ground electrodes.

Figure 5:
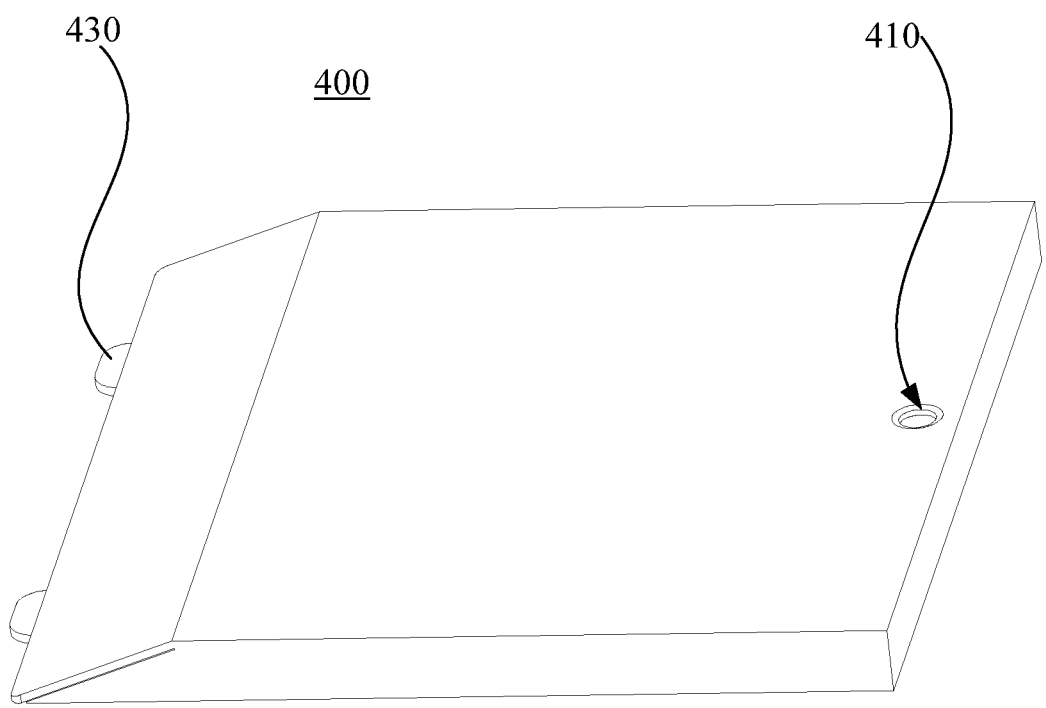
FIG. 5 is a perspective view of the upper housing of FIG. 1.

Referring also to FIG. 5, the upper cover 400 is positioned on the opening end 110 of the lower housing 100, the upper cover 400 and the upper housing 200 cooperatively cover the opening end 110. The upper cover 400, the separating board 300, and the rest part of the lower housing 100 cooperatively form a wiring chamber 140. The LED driving structure 100 further includes a plurality of wiring terminals 500. The plurality of wiring terminals 500 are received in the wiring chamber 140 and electrically connect with the power source module 130. The wiring terminals 500 are further connected to a plurality of external wirings, such that the power source module 130 is electrically connected to external via the wiring terminals 500.

In above LED driving structure 10, the lower housing 100, the upper housing 200, the separating board 300, and the upper cover 400 and other components cooperatively from the independent electrical chamber 120 and the independent wiring chamber 140 to separate the electrical module such as the power source module 130 from input/output the plurality of wiring wires, thereby guaranteeing the power source module 130 can work in an independent environment, lowing a temperature of the working environment, improving the working environment, extending a service life of the power source module 130, and meeting a requirement of the United States UL safety certification.

In addition, the above LED driving structure 10 is integrally designed as a whole, thus reducing a volume and a cost. During operation, user opens the upper cover 400 and connect the input/output wirings with the LED driving structure 10, facilitating to assembly and operate the LED driving structure 10 by the end-user.

Referring to FIG. 3 and FIG. 4 again, a periphery of the opening end 110 is provided with a plurality of latching snaps 112, the upper housing 200 defines a plurality of latching grooves 210. The latching snaps 112 engage with the latching grooves 210, such that the upper housing 200 is secured to the opening end 110.

Specifically, in the illustrated embodiment, the number of the latching snaps 112 is more than two, the plurality of latching snaps 112 are respectively distributed on opposite sides of the periphery of the opening end 110. The upper housing 200 defines a plurality of latching grooves 210 correspondingly. The plurality of latching grooves 210 latch with the plurality of latching snaps 112, respectively, to enable the upper housing 200 to be firmly fixed to the opening end 110, and the upper housing 200 cannot be easily opened, meeting a requirement of the United States UL safety certification.

Referring to FIG. 3 and FIG. 5 again, the opening end 110 defines a screw hole 114, the upper cover 400 defines a through hole 410. The LED driving structure 10 further includes a threaded fastener (not shown). The threaded fastener extends through the through hole 410 and engages with the screw hole 114, thereby securing the upper cover 400 to the opening end 110.

Specifically in the embodiment, the lower housing 100 has an elongated shape, the screw hole 114 is positioned on an end of the lower housing 100 away from the upper housing 200. The opening end 110 is provided with a buckle 116 extending inwardly, the screw hole 114 is defined on the buckle 116. An end of the upper cover 400 can be effectively fixed by virtue of the threaded fastener.

The upper housing 200 further defines a notch 230, the upper cover 400 is further provided with a lug 430, the lug 430 is latched within the notch 230. The other end of the upper cover 400 is fixed by virtue of latching the lug 430 in the notch 230.

When a wiring process is to be performed, the threaded fastener is screwed off, the upper cover 400 can be turned over, and a wiring operation can be preformed.

Referring to FIG. 3 again, the lower cover 100 is further provided with a wiring hole 180 in fluid communication with the wiring chamber 140. The wiring hole 180 can also be provided with a metallic cover 190. The wiring operation is desired to be performed, the metallic cover 190 is knocked off, and a wiring tube extends through the wiring hole 180 and connects with the wiring terminals 500 in the wiring chamber 140.

In above LED driving structure 10, the lower housing 100, the upper housing 200, the separating board 300, and the upper cover 400 and other components cooperatively form the independent electrical chamber 120 and the independent wiring chamber 140, to separate the electrical module such as the power source module 130 from input/output wiring wires, thereby ensuring the power source module 130 to be able of working in an independent environment, reducing a temperature of the working environment, improving the working environment, extending a service life of the power source module 130, and meeting a requirement of the United States UL safety certification.

In addition, the above LED driving structure 10 is integrally designed as a whole, reducing a volume and a cost. When operation, user open the upper cover 400 and can connect the input/output wirings to the LED driving structure 10, facilitating for the end-user to assembly and operate.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A LED (Light Emitting Diode) driving structure, comprising:
   a lower housing being a box structure and having an opening end;
   a upper housing positioned on the opening end of the lower housing, and covering a part of the opening end;
   a separating board positioned on an end of the upper housing and being perpendicular to the upper housing, wherein the upper housing, the separating board, and a part of the lower housing cooperatively form an electrical chamber; and
   an upper cover positioned on the opening end of the lower housing, wherein the upper cover and the upper housing cooperatively cover the opening end, the upper cover, and the separating board, and the remaining part of the lower housing cooperatively form a wiring chamber;
   wherein the upper housing further defines at least one notch;
   wherein the upper cover is further provided with at least one lug; and
   wherein the at least one lug is latched within the at least one notch.

2. The LED driving structure according to claim 1, further comprising a power source module and a wiring terminal, wherein the power source module is received in the electrical chamber, the wiring terminal is received in the wiring chamber, the power source module is electrically connected to the wiring terminal.

3. The LED driving structure according to claim 1, wherein the opening end is provided with a latching snap at a periphery thereof, the upper housing defines a latching groove, the latching snap engages with the latching groove, such that the upper housing is secured to the opening end.

4. The LED driving structure according to claim 3, wherein a number of the latching snaps is more than two, a plurality of latching snaps are distributed on opposite sides of the periphery of the opening end, respectively, the upper housing defines a plurality of latching grooves correspondingly, the plurality of latching grooves latch with the plurality of latching snaps, respectively.

5. The LED driving structure according to claim 1, wherein the opening end defines a screw hole, the upper cover defines a through hole, the LED driving structure further comprises a threaded fastener, the threaded fastener extends through the through hole and engages with the screw hole, thereby securing the upper cover to the opening end.

6. The LED driving structure according to claim 5, wherein the opening end is provided with a buckle extending inwardly, the screw hole is defined on the buckle.

7. The LED driving structure according to claim 5, wherein the lower housing has an elongated shape, the screw hole is positioned at an end of the lower housing away from the upper housing.

8. The LED driving structure according to claim 5, wherein the lower housing is further provided with a wiring hole, the wiring hole is in fluid communication with the wiring chamber.

9. The LED driving structure according to claim 1, wherein the separating board and the upper housing are integrally formed.

10. The LED driving structure according to claim 1, wherein the lower housing has an elongated shaped box structure, wherein the end of the lower housing away from the upper housing is taller than the upper housing positioned on the opening end of the lower housing.

11. The LED driving structure according to claim 10, wherein the upper cover includes an angled portion extending between the upper housing positioned on the opening end of the lower housing and the taller end of the lower housing; and wherein the upper cover angled portion is provided with said at least one lug.

* * * * *